(12) United States Patent
Lee

(10) Patent No.: US 11,859,153 B2
(45) Date of Patent: Jan. 2, 2024

(54) METHOD FOR CLEANING SUBSTRATE AND SYSTEM FOR CLEANING SUBSTRATE

(71) Applicant: CHANGXIN MEMORY TECHNOLOGIES, INC., Hefei (CN)

(72) Inventor: Shih-Hung Lee, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/823,501

(22) Filed: Aug. 30, 2022

(65) Prior Publication Data
US 2023/0147501 A1    May 11, 2023

Related U.S. Application Data

(63) Continuation of application No. PCT/CN2022/087091, filed on Apr. 15, 2022.

(30) Foreign Application Priority Data

Nov. 8, 2021 (CN) .......................... 202111315712.9

(51) Int. Cl.
| | | |
|---|---|---|
| *C11D 11/00* | (2006.01) | |
| *C11D 7/02* | (2006.01) | |
| *C11D 7/50* | (2006.01) | |
| *B08B 3/02* | (2006.01) | |
| *B08B 3/04* | (2006.01) | |
| *B08B 13/00* | (2006.01) | |

(Continued)

(52) U.S. Cl.
CPC .......... *C11D 11/0047* (2013.01); *B08B 3/022* (2013.01); *B08B 3/041* (2013.01); *B08B 3/08* (2013.01); *B08B 7/0035* (2013.01); *B08B 7/04* (2013.01); *B08B 13/00* (2013.01); *C11D 7/02* (2013.01); *C11D 7/5022* (2013.01); *C11D 11/0058* (2013.01); *F26B 5/005* (2013.01); *H01L 21/02057* (2013.01)

(58) Field of Classification Search
CPC ..... C11D 11/0047; C11D 7/02; C11D 7/5022; C11D 11/0058; B08B 3/022; B08B 3/041; B08B 3/08; B08B 7/0035; B08B 7/04; B08B 13/00; F26B 5/005; H01L 21/02057
See application file for complete search history.

(56) References Cited

U.S. PATENT DOCUMENTS

| | | |
|---|---|---|
| 9,673,037 B2 | 6/2017 | Sirard |
| 10,068,781 B2 | 9/2018 | Sirard |
| (Continued) | | |

FOREIGN PATENT DOCUMENTS

| | | |
|---|---|---|
| CN | 1567541 A | 1/2005 |
| CN | 103650116 A | 3/2014 |
| (Continued) | | |

*Primary Examiner* — Sharidan Carrillo
(74) *Attorney, Agent, or Firm* — Syncoda LLC; Feng Ma

(57) ABSTRACT

A method for cleaning a substrate includes the following: exposing the substrate to a cleaning agent to remove impurities on a surface of the substrate; exposing the substrate to a dewetting chemical agent in a liquid phase to remove the cleaning agent on the surface of the substrate; solidifying the dewetting chemical agent in the liquid phase remaining on the surface of the substrate to obtain the dewetting chemical agent in a solid phase; and sublimating and removing the dewetting chemical agent in the solid phase.

11 Claims, 5 Drawing Sheets

(51) Int. Cl.
B08B 7/00 (2006.01)
B08B 7/04 (2006.01)
F26B 5/00 (2006.01)
B08B 3/08 (2006.01)
H01L 21/02 (2006.01)

(56) References Cited

U.S. PATENT DOCUMENTS

| | | | |
|---|---|---|---|
| 11,417,511 B1* | 8/2022 | Chang | H01L 21/02041 |
| 2004/0140298 A1* | 7/2004 | Widmann | H01L 21/67028 |
| | | | 219/121.69 |
| 2005/0208774 A1 | 9/2005 | Fukunaga | |
| 2012/0304483 A1 | 12/2012 | Sirard | |
| 2015/0155159 A1* | 6/2015 | Igarashi | H01L 21/02057 |
| | | | 134/28 |
| 2015/0221500 A1* | 8/2015 | Ogihara | G03F 7/40 |
| | | | 134/28 |
| 2016/0097590 A1 | 4/2016 | Sirard et al. | |
| 2020/0152447 A1* | 5/2020 | Sasaki | F26B 5/005 |
| 2021/0057210 A1* | 2/2021 | Wojtczak | H01L 21/02057 |
| 2021/0210341 A1 | 7/2021 | Thorum | |
| 2022/0208563 A1* | 6/2022 | Negoro | H01L 21/68742 |
| 2023/0107142 A1* | 4/2023 | Sasaki | H01L 21/67034 |
| | | | 427/346 |

FOREIGN PATENT DOCUMENTS

| | | | | |
|---|---|---|---|---|
| CN | 105489529 A | | 4/2016 | |
| SG | 142224 A1 * | | 5/2008 | G03F 7/427 |
| TW | 201432808 A | | 8/2014 | |
| WO | WO-2006050950 A1 * | | 5/2006 | B08B 7/0014 |

* cited by examiner

US 11,859,153 B2

METHOD FOR CLEANING SUBSTRATE AND SYSTEM FOR CLEANING SUBSTRATE

CROSS-REFERENCE TO RELATED APPLICATIONS

The disclosure is a U.S. continuation application of International Application No. PCT/CN2022/087091 filed on Apr. 15, 2022, which claims priority to Chinese Patent Application No. 202111315712.9 filed on Nov. 8, 2021. The disclosures of the above-referenced applications are hereby incorporated by reference in their entirety.

BACKGROUND

A substrate, such as a semiconductor wafer is manufactured via multiple processes, which may include a deposition process, a planarization process, a lithography process, an etching process, and the like. For each of these processes, a key wet cleaning process is required to ensure the proceeding of subsequent processes. However, when cleaning the substrate, there are often some problems, such as poor cleanliness, residues of cleaning agents, and damage to the substrate structure, which seriously reduces the yield and wastes production capacity. With the increasing integration of devices, how to optimize the method for cleaning a substrate has become an urgent technical problem to be solved at present.

SUMMARY

The disclosure relates to, but is not limited to, a method for cleaning a substrate and a system for cleaning a substrate.

The embodiments of the disclosure provide a method for cleaning a substrate. The method includes the following operations. The substrate is exposed to a cleaning agent to remove impurities located on a surface of the substrate. The substrate is exposed to a dewetting chemical agent in a liquid phase to remove the cleaning agent on the surface of the substrate. The dewetting chemical agent in the liquid phase remaining on the surface of the substrate is solidified to obtain the dewetting chemical agent in a solid phase. The dewetting chemical agent in the solid phase is sublimated to remove the dewetting chemical agent.

The embodiments of the disclosure also provide a system for cleaning a substrate. The system includes: a chamber for receiving and processing the substrate; a wafer stage for supporting and clamping the substrate in the chamber; a nozzle for at least providing a dewetting chemical agent in a liquid phase to a surface of the substrate; a vacuum pump for controlling a pressure of the chamber; a temperature controller for controlling a temperature of the substrate and/or the chamber; an atmosphere control system for exhausting a gas from the chamber or supplying a gas into the chamber; and a controller in communication with the vacuum pump, the temperature controller, and the atmosphere control system and configured to solidify the dewetting chemical agent in the liquid phase to obtain the dewetting chemical agent in a solid phase, and configured to remove the dewetting chemical agent in the solid phase.

BRIEF DESCRIPTION OF THE DRAWINGS

To more clearly illustrate technical solution in the embodiments of the disclosure or conventional techniques, the drawings needed in the embodiments will be briefly described below. It is apparent that the drawings described below are merely some embodiments of the disclosure. Other drawings can be obtained by a person of ordinary skill in the art according to these drawings without any creative work.

DETAILED DESCRIPTION

Figure 1:
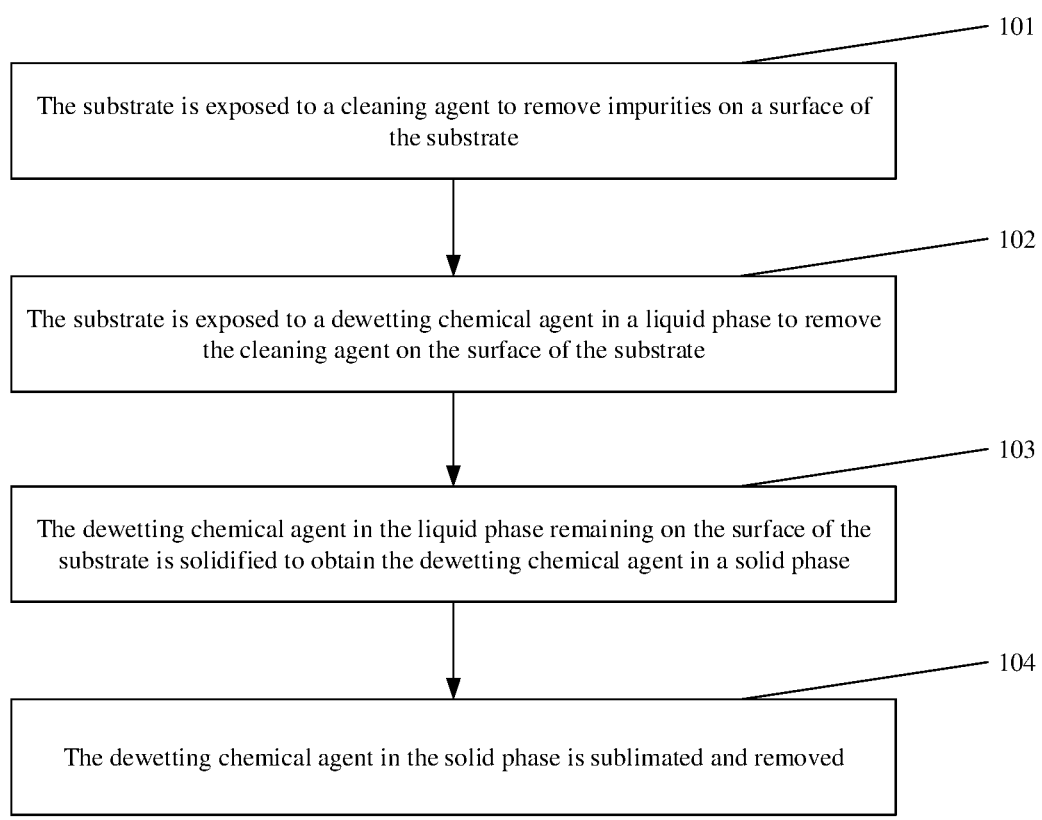
FIG. 1 shows a flowchart of a method for cleaning a substrate provided by an embodiment of the disclosure.

Exemplary embodiments disclosed in the disclosure are described in more detail with reference to drawings. Although the exemplary embodiments of the disclosure are shown in the drawings, it should be understood that the disclosure may be implemented in various forms and should not be limited by the specific embodiments described here. On the contrary, these embodiments are provided for more fully understanding of the disclosure, and to completely convey a scope disclosed by the disclosure to a person skilled in the art.

In the drawings, the sizes of a layer, a region, and an element and their relative sizes may be magnified for clarity. The same reference sign represents the same element throughout.

It should be understood that while the element or the layer is referred to as being "on . . . ", "adjacent to . . . ", "connected to . . . " or "coupled to . . . " other elements or layers, it may be directly on the other elements or layers, adjacent to, connected or coupled to the other elements or layers, or an intermediate element or layer may be present. In contrast, while the element is referred to as being "directly on . . . ", "directly adjacent to . . . ", "directly connected to . . . " or "directly coupled to . . . " other elements or layers, the intermediate element or layer is not present. It should be understood that although terms "first", "second", "third" and the like may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teaching of the disclosure, a first element, component, region, layer, or section discussed below may be represented as a second element, component, region, layer or section. While the second element, component, region, layer, or section is discussed, it does not mean that the first element, component, region, layer or section is necessarily present in the disclosure.

Spatial relation terms, such as "under . . . ", "below . . . ", "lower", "underneath . . . ", "above . . . ", "upper" and the like, may be used here for conveniently describing a relationship between one element or feature shown in the drawings and other elements or features. It should be understood that in addition to orientations shown in the drawings, the spatial relation terms are intended to further include the different orientations of a device in use and operation. For example, if the device in the drawings is turned over, then the elements or the features described as "below" or "underneath" or "under" other elements may be oriented "on" the other elements or features. Therefore, the exemplary terms "below . . . " and "under . . . " may include two orientations of up and down. The device may be otherwise oriented (rotated by 90 degrees or other orientations) and the spatial relation terms used here are interpreted accordingly.

The terms used here are only intended to describe the specific embodiments and are not limitations to the disclosure. As used herein, singular forms of "a", "an" and "said/the" are also intended to include plural forms, unless otherwise clearly indicated in the context. It should also be understood that terms "composing" and/or "including", while used in the description, demonstrate the presence of the described features, integers, steps, operations, elements and/or components, but do not exclude the presence or addition of one or more other features, integers, steps, operations, elements, components, and/or groups. As used herein, a term "and/or" includes any and all combinations of related items listed.

The embodiments of the disclosure provide a method for cleaning a substrate. With reference to FIG. 1, the method includes the following steps.

At step 101, the substrate is exposed to a cleaning agent, to remove impurities located on a surface of the substrate.

At step 102, the substrate is exposed to a dewetting chemical agent in a liquid phase, to remove the cleaning agent on the surface of the substrate.

At step 103, the dewetting chemical agent in the liquid phase remaining on the surface of the substrate is solidified, to obtain the dewetting chemical agent in a solid phase.

At step 104, the dewetting chemical agent in the solid phase is sublimated and removed.

Figure 2:
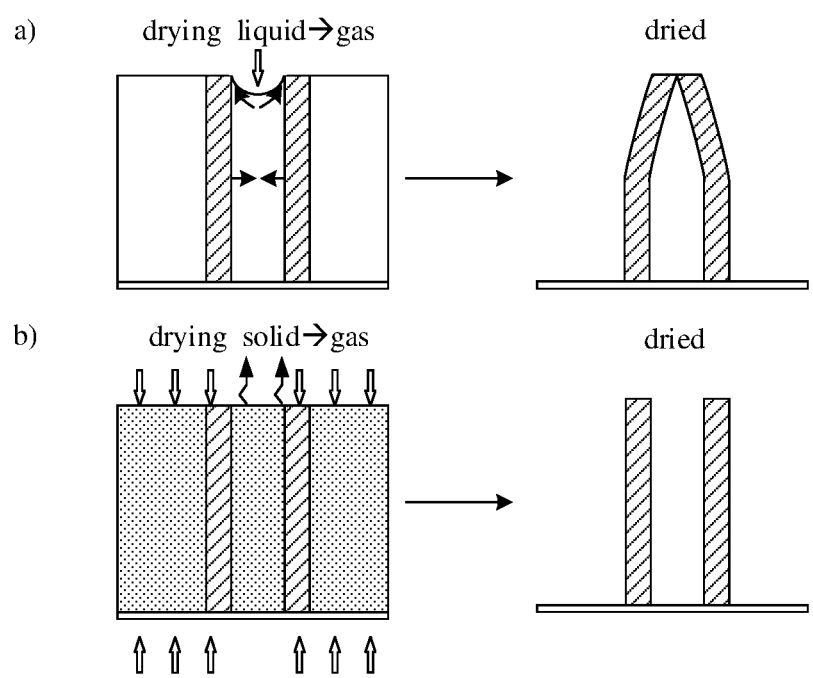
FIG. 2 shows a principle analysis diagram of a method for cleaning a substrate provided by an embodiment of the disclosure.

As shown in FIG. 2, due to the limitations of the polishing process or device design, the surface of the substrate is often not smooth, but distributed with some fine structures, such as high aspect ratio structures (such as pillars), spaces and the like. Therefore, the cleaning agent, after cleaning, may remain in some tiny spaces or between adjacent high aspect ratio structures on the surface of the substrate, and generate capillary force between the adjacent structures. The capillary force will damage the surface structure of the substrate during subsequent drying processes, and also prevent the removal of residual cleaning agent (as shown in a) of FIG. 2.

Combined with b) of FIG. 2, it can be seen that in the embodiments of the disclosure, the dewetting chemical agent in the liquid phase is removed by sublimating after solidified. The solidified dewetting chemical agent can eliminate the vapor/liquid interface, so that the surface tension is approach to zero. Therefore, the capillary forces are eliminated in the subsequent sublimation and removal process, reducing the damage of capillary forces to the substrate structure, and achieving the effect of nondestructive cleaning. Meanwhile, because the influence of the capillary forces is eliminated, the residue of the cleaning agent and impurities on the surface of the substrate can be greatly reduced.

The method for cleaning a substrate provided by the embodiments of the disclosure will be described in detail below with reference to FIG. 3A to FIG. 3B.

Figure 3A:
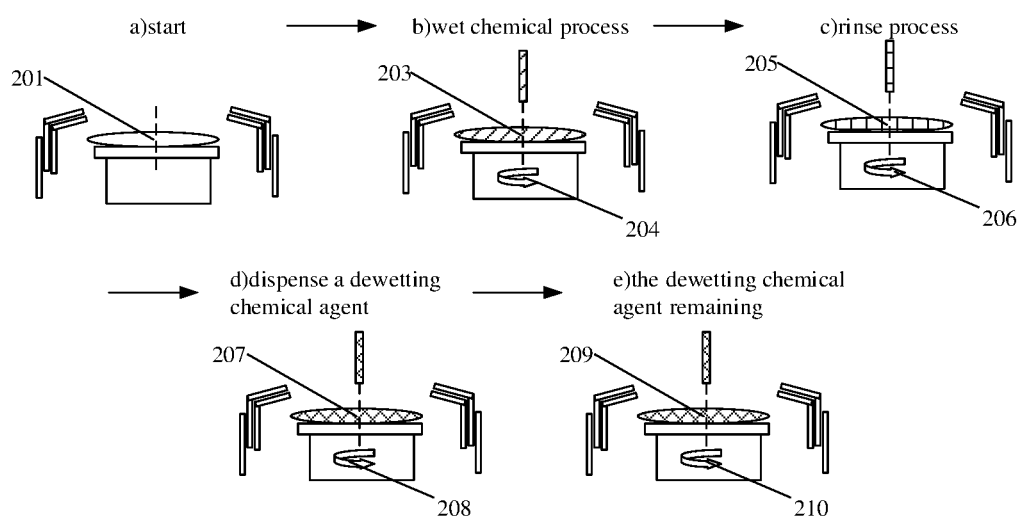
FIG. 3A is a first schematic diagram of operations during a process for cleaning a substrate provided by an embodiment of the disclosure.

As shown in a) of FIG. 3A, a substrate 201 to be cleaned is provided, and may have some impurities on the surface thereof. The impurities may be dirt, foreign matter, moisture, or may be sacrificial materials or mask materials from previous processes, such as residues of dry etching.

In some embodiments, the surface of the substrate includes a space structure having an aspect ratio greater than or equal to 8. In practice, the substrate may be a wafer, the space structure may correspond to an isolation region (e.g. shallow trench isolation (STI) region) or a high aspect ratio feature (e.g. features used in forming capacitors, transistors, and other electrical components). The space structure may have a high aspect ratio (HAR), and the HAR may be 15 to 1, 30 to 1, or higher. In some embodiments, the space structure also includes a structure with a half pitch less than 19 nm.

Next, step 101 is performed. The substrate is exposed to a cleaning agent to remove impurities located on the surface of the substrate, as shown in b) and c) in FIG. 3A. In some embodiments, the cleaning agent is miscible with the impurities. In the practices, the cleaning agent may include, for example, but is not limited to, deionized water (DI water), aqueous ammonium hydroxide solution, aqueous hydrochloric acid solution, aqueous hydrogen peroxide solution, and the like.

In some embodiments, the expose of the substrate to the cleaning agent may include the following operations. The substrate is controlled to spin at a third speed, and then a first cleaning agent is sprayed on the surface of the substrate. The substrate is controlled to spin at a fourth speed, and then a second cleaning agent is sprayed on the surface of the substrate to remove the first cleaning agent located on the surface of the substrate. In view of the above, first, the first cleaning agent is used for primary cleaning to remove most of the impurities dissolved in the first cleaning agent, and then, the second cleaning agent is used for secondary cleaning to remove the first cleaning agent and the impurities dissolved in the second cleaning agent, so that the effective removal of impurities is ensured and the cleanliness is improved through multiple cleanings.

Specifically, as shown in b) of FIG. 3A, the substrate is controlled to spin at the third speed 204, and the first cleaning agent 203 is sprayed on the surface of the substrate. In the practices, the third speed may be in a range of 500 to 1200 rpm (revolutions per minute). The first cleaning agent may be a wet chemical agent to remove impurities on the surface of the substrate.

Next, as shown in c) of FIG. 3A, the substrate is controlled to spin at the fourth speed 206, and the second cleaning agent 205 is sprayed on the surface of the substrate, to remove the first cleaning agent 203 on the surface of the substrate. In the practices, the third speed may be in range of 500 to 1200 rpm (revolutions per minute), and the second cleaning agent may be deionized water.

Next, step 102 is performed. As shown in d) and e) in FIG. 3A, the substrate is exposed to the dewetting chemical agent in a liquid phase 207 to remove the cleaning agent on the surface of the substrate.

In some embodiments, in the method, the dewetting chemical agent in the liquid phase has the saturated vapor pressure greater than 4.0 KPa at room temperature, the miscibility of the dewetting chemical agent in the liquid phase with the cleaning agent is greater than 70%, and the dewetting chemical agent in the liquid phase has the evaporation rate greater than 1. In the practices, the cleaning agent and the dewetting chemical agent may be deionized water and acetone, respectively. Thus, it is facilitated to mix the dewetting chemical agent in the liquid phase and the cleaning agent, and to accelerate the evaporation ratio. The cleaning agent can be replaced by the dewetting chemical agent in the liquid phase more easily, thus improving the cleaning efficiency.

In some embodiments, the dewetting chemical agent in the liquid phase includes acetone or isopropanol. Both acetone and isopropanol have lower surface tension, which can reduce the risk of structural deformation or collapse of the surface of the substrate during evaporation.

In some embodiments, the expose of the substrate to the dewetting chemical agent in the liquid phase to remove the cleaning agent on the surface of the substrate may include the following operations. The substrate is controlled to spin at a first speed, and the dewetting chemical agent in the liquid phase is sprayed on the surface of the substrate to dissolve the cleaning agent remaining on the surface of the substrate in the dewetting chemical agent in the liquid phase. The substrate is controlled to spin at a second speed to remove part of the dewetting chemical agent in the liquid phase on the surface of the substrate, in which the second speed is less than the first speed. The cleaning agent is replaced by the dewetting chemical agent in the liquid phase through high-speed spin, and then the substrate is spinning at a lower speed, so that only part of the dewetting chemical agent in the liquid phase remains on the surface of the substrate, thereby reducing the sample amount in subsequent freeze-drying, and improving the cleaning efficiency.

Specifically, as shown in d) of FIG. 3A, the substrate is controlled to spin at the first speed 208, and the dewetting chemical agent in the liquid phase 207 is sprayed on the surface of the substrate to dissolve the cleaning agent remaining on the surface of the substrate in the dewetting chemical agent in the liquid phase. In the practices, the first speed may be in a range of 500 to 1200 rpm (revolutions per minute), the cleaning agent may be deionized water, and the dewetting chemical agent may be acetone.

Next, as shown in e) of FIG. 3A, the substrate is controlled to spin at the second speed 210 to remove part of the dewetting chemical agent in the liquid phase on the surface of the substrate, in which the second speed is less than the first speed. Thus, a residual dewetting chemical agent in the liquid phase 209 on the surface of the substrate is obtained. In the practices, the second speed may be in a range of 5 to 50 rpm (rpm) and the dewetting chemical agent may be acetone.

Next, step 103 is performed. As shown in f) and g) of FIG. 3B, the residual dewetting chemical agent in the liquid phase 209 on the surface of said substrate is solidified to obtain the dewetting chemical agent in a solid phase 211. In the practices, the dewetting chemical agent in the liquid phase can be solidified by physical reaction or chemical reaction. In some embodiments, the dewetting chemical agent in the liquid phase is exposed to a reactive gas, in which the dewetting chemical agent in the liquid phase includes acetic acid and the reactive gas includes ammonia. For example, acetic acid reacts with ammonia to form volatile solid ammonium salt.

In some embodiments, the solidification of the residual dewetting chemical agent in the liquid phase 209 on the surface of the substrate to obtain the dewetting chemical agent in the solid phase 211 includes the following operations. The temperature and/or pressure is controlled to solidify the residual dewetting chemical agent in the liquid phase 209 on the surface of the substrate into the dewetting chemical agent in a solid phase. By controlling the temperature and/or pressure, the dewetting chemical agent is solidified via physical reaction, which is environmentally friendly and can avoid introducing intermediates to contaminate the substrate.

In some embodiments, the solidification of the residual dewetting chemical agent in the liquid phase 209 on the surface of the substrate to obtain the dewetting chemical agent in the solid phase 211 includes the following operations. The substrate is controlled to spin at the fifth speed 212, and the temperature and/or pressure of the chamber is controlled such that the temperature of the chamber is below the freezing point of the dewetting chemical agent in a liquid phase under the pressure of the chamber, to solidify the residual dewetting chemical agent in the liquid phase on the substrate into the dewetting chemical agent in the solid phase. In the practices, the fifth speed of the substrate is controlled in a range of 5 to 50 rpm (revolutions per minute), the temperature of the chamber is controlled in a range of −120 to −40° C., and the pressure of the chamber is controlled from 0.1 to 100 mTorr (millitorr). If the pressure or temperature of the chamber is too high, it is not conducive to the solidification of the dewetting chemical agent in the liquid phase; while if the temperature and pressure are too low, it will require more severe process requirements and increase energy consumption. In other embodiments, the chamber or the wafer stage can be precooled first, and thus when the substrate is placed on the wafer stage, the dewetting chemical agent in the liquid phase can be quickly cooled to −30° C., thereby freezing the dewetting chemical agent. Because the dewetting chemical agents are volatile, rapid cooling can prevent the substrate from being affected by capillary force during volatilization of the dewetting chemical agent. In the practices, the dewetting chemical agent is frozen within no more than 30 seconds and the pressure of the chamber is reduced within no more than 20 seconds. In other embodiments, the rapid cooling can be achieved by contacting the substrate with liquid nitrogen.

In some embodiments, in the method, the density value of the dewetting chemical agent in the liquid phase is less than the density value of the dewetting chemical agent in the solid phase. In this way, during solidification, the structure of the surface of the substrate would not be destroyed due to the increase in volume during phase transition of the dewetting chemical agent.

Finally, step 104 is performed. As shown in h) and i) of FIG. 3B, the dewetting chemical agent in the solid phase 211 is sublimated and removed. It should be noted that, the term "sublimation" refers to the conversion of a dewetting chemical agent in solid phase into gas phase. The conversion may be caused by chemical reaction, for example, the dewetting chemical agent in the solid phase is decomposed into one or more gases. In the practices, when the dewetting chemical agent in the solid phase is an ammonium salt, the dewetting chemical agent in the solid phase may be decomposed, for example, by heating ammonium salt crystals. In other embodiments, the method may further include an operation of mechanical removing part of the dewetting chemical agent in the solid phase, before sublimating and removing the dewetting chemical agent in the solid phase. In the practices, the part of the dewetting chemical agent in the solid phase can be removed by external force or vibration. Specifically, it can be directly grasped by a mechanical arm or directly purged by an air gun. In this way, the cleaning efficiency can be improved and the energy consumption can be reduced.

In some embodiments, the sublimation and removal of the dewetting chemical agent in the solid phase 211 includes the following operations. A temperature and/or pressure is controlled to sublimate the dewetting chemical agent in solid phase into a dewetting chemical agent in gas form, and the dewetting chemical agent in gas form is vented out. By controlling the temperature and/or pressure, the dewetting chemical agent in the solid phase is sublimated by physical reaction, which is environmentally friendly and can avoid introducing intermediates to contaminate the substrate.

Figure 3B:
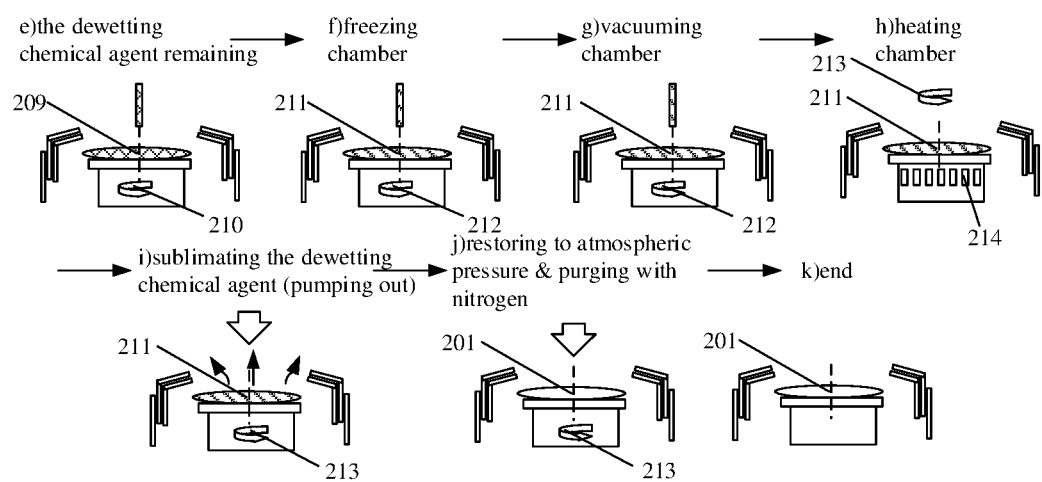
FIG. 3B is a second schematic diagram of operations during a process for cleaning a substrate provided by an embodiment of the disclosure.

In some embodiments, as shown in h) and i) of FIG. 3B, the removal of the dewetting chemical agent in the solid phase 211 includes the following operations. The substrate is controlled to spin at a sixth speed 213, and the temperature and/or pressure of the chamber is controlled such that the temperature of the chamber is higher than the sublimation point of the dewetting chemical agent in the solid phase under the pressure of the chamber, to sublimate the dewetting chemical agent in the solid phase into the dewetting chemical agent in a gas form. In the practices, the sixth speed of the substrate is controlled in a range of 100 to 1000 rpm (revolutions per minute) and the temperature of the chamber is controlled in a range of 20 to 50° C. If the temperature of the chamber is too low, it is not conducive to the sublimation of the dewetting chemical agent in solid phase, while if the temperature is too high, the energy consumption would be increased.

Specifically, as shown in h), i) of FIG. 3B, the dewetting chemical agent in solid phase can be directly heated into the chemical agent in gas phase without melting into the dewetting chemical agent in liquid phase, by a heating unit 214 located in the wafer stage below the substrate and a heating lamp (not shown in the figure) above the substrate. Then, the temperature of the chamber is raised for a secondary drying, while keeping the pressure of the chamber at a lower pressure, the dewetting chemical agent in gas phase is obtained, and the sublimated dewetting chemical agent in gas phase is directly removed. In other embodiments, the secondary drying is performed under a temperature higher than the triple point temperature of the dewetting chemical agent, and multiple dryings can ensure the complete removal of the dewetting chemical agent in solid phase. For example, the dewetting chemical agent in gas phase can be removed by a dry vacuum pump. In the practices, the atmosphere of the chamber is nitrogen, argon, helium or other inert gases, which can prevent the substrate from being contaminated, make the heat distribution in the chamber uniform and improve the heat transfer rate.

In some embodiments, as shown in i) of FIG. 3B, the method further includes, after removing the dewetting chemical agent in gas phase, an operation of exposing the substrate to an inert gas to place the substrate at atmospheric pressure, in which the substrate is purged along a center of the substrate toward edge with the inert gas. In the practices, the pressure of the chamber is restored to atmospheric pressure by supplying the chamber with the inert gas, and the inert gas purges the surface of the substrate from the center to the edge of the substrate, to ensure that no dry chemical are remained. The inert gas may be nitrogen or noble gases, such as argon and helium. When the chamber is brought to atmospheric pressure by the inert gas, the substrate can be cleaned again. The residual dewetting chemical agent on the surface of the substrate can be removed by direct purging, and the cleaning efficiency can also be improved by purging from the center to the edge. On the other hand, the inert gas is not easy to react with other substances in the substrate or in the environment of the chamber, so it does not cause a secondary contamination.

In some embodiments, the first speed 208, the third speed 204, and the fourth speed 206 are greater than the sixth speed 213, and the sixth speed 213 is greater than the second speed 210 and the fifth speed 212. For example, the first speed, the third speed and the fourth speed may be in a range of 500 to 1200 rpm (revolutions per minute), the sixth speed may be in a range of 100 to 1000 rpm (revolutions per minute), and the second speed and the fifth speed may be in a range of 5 to 50 rpm (revolutions per minute). Relatively fast spinning speed can improve the cleaning efficiency, and relatively slow spinning speed can ensure that the structure of the surface of the substrate is not damaged during cleaning.

In some embodiments, the method further includes, after removing the dewetting chemical agent in solid phase, an operation that the substrate is exposed to a cleaning gas for plasma ashing. The cleaning gas includes $H_2N_2$ gas. When $H_2N_2$ gas is used as a cleaning gas, H from $H_2N_2$ de-chains the carbonized to shorter chain, so as to volatile easier. Furthermore, hydrogen reacts with carbon, hydrogen and oxygen (C, H, O) of the residual dewetting chemical agent to form volatile substances. The dewetting chemical agent will be completely removed after the ashing process, which increases the cleanliness of the substrate and is beneficial to the performance of the semiconductor device. The $H_2N_2$ gas contains 96% $N_2$, and has a similar function as $N_2$ on ashing process enhancement. In the practices, the ashing process may be performed under the following parameters: the temperature of the ashing chamber of 220 to 280° C., the radio frequency power of 2000 to 5000 W, the pressure of the ashing chamber of 50 to 1500 mTorr (millitorr), and the ashing time of 5 to 300 seconds.

In some embodiments, the $H_2N_2$ gas has a purity of at least 98%. There is no extra oxide layer on the surface of the substrate after ashing with pure $H_2N_2$, and no intermediates are formed, so the cleanliness of the substrate is improved. In the practices, the flow rate of the $H_2N_2$ gas may be 5000 to 15000 sccm (standard ml/min).

Figure 4:
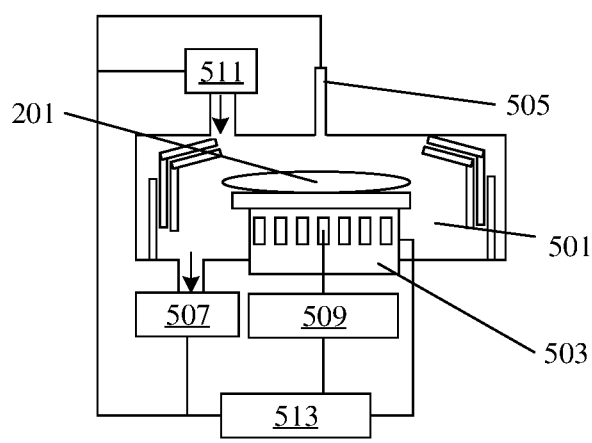
FIG. 4 shows a schematic diagram of a system for cleaning a substrate provided by an embodiment of the disclosure.

Embodiments of the disclosure also provide a system for cleaning a substrate. As shown in FIG. 4, the system includes: a chamber 501 for receiving and processing the substrate 201; a wafer stage 503 for supporting and clamping the substrate 201 in the chamber; a nozzle 505 for at least providing a dewetting chemical agent in a liquid phase to the surface of the substrate; a vacuum pump 507 for controlling a pressure of the chamber; a temperature controller 509 for controlling a temperature of the substrate and/or the chamber; an atmosphere control system 511 for exhausting a gas from the chamber or supplying a gas into the chamber; a controller 513 in communication with the vacuum pump 507, the temperature controller 509 and the atmosphere control system 511, and configured to solidify the dewetting chemical agent in the liquid phase to into a dewetting chemical agent in solid phase and configured to remove the dewetting chemical agent in the solid phase. In the practices, various different devices, such as a dry vacuum pump, a mechanical pump, a cryopump, and/or a turbomolecular pump can be used as the vacuum pump to reduce the pressure of the chamber. The atmosphere control system may be configured to supply an inert gas, such as nitrogen, argon, helium, or the like, to the chamber at a controlled flow rate to maintain the pressure of the chamber, or configured to directly purge the substrate with the inert gas. In the practices, the temperature controller may include a refrigerator system having one or more refrigerators or thermoelectric units. The cooling and/or heating of the substrate may be accomplished by the refrigerator system having one or more refrigerators or thermoelectric units. In the practices, the controller may be an electronic device having various integrated circuits, logics, memories, and/or software to receive instructions, issue instructions, control operations, etc. The controller 513 may be connected to one or more sensors that monitor operating parameters (such as temperature, pressure, etc.) of the chamber 501. A temperature controller 509 may be provided as needed to control the temperature of the substrate and/or the chamber. An atmosphere control system may be provided as needed to exhaust a gas from the chamber or supply a gas into the chamber. A vacuum pump may be provided as needed to control the pressure of the chamber.

In some embodiments, the controller configured to solidify the dewetting chemical agent in the liquid phase to obtain the dewetting chemical agent in the solid phase is operated to control a temperature and/or pressure of the chamber to bring the temperature of the chamber lower than a freezing point of the dewetting chemical agent in the liquid phase under the pressure of the chamber, to solidify the dewetting chemical agent in the liquid phase into the dewetting chemical agent in the solid phase.

In some embodiments, the controller configured to remove the dewetting chemical agent in the solid phase is operated to control the temperature and/or pressure of the chamber, to bring the temperature of the chamber higher than a sublimation point of the dewetting chemical agent in the solid phase under the pressure of the chamber, to sublimate the dewetting chemical agent in the solid phase into the dewetting chemical agent in a gas phase and remove the dewetting chemical agent in the gas phase.

In this way, the dewetting chemical agent in the liquid phase is removed by sublimating after solidified. The solidified dewetting chemical agent can eliminate the vapor/liquid interface, so that the surface tension is approach to zero. Therefore, the capillary forces are eliminated in the subsequent sublimation and removal process, reducing the damage of the capillary forces to the substrate structure and achieving the effect of nondestructive cleaning.

In some embodiments, as shown in FIG. 4, the system includes the controller in communication with the wafer stage 503 and the nozzle 505, and the controller is further configured to control the wafer stage to spin at the first speed, control the nozzle to provide the dewetting chemical agent in the liquid phase to the surface of the substrate, and to control the wafer stage to spin at the second speed less than the first speed. The cleaning agent is replaced by the dewetting chemical agent in the liquid phase through high-speed spin, and then the substrate is spinning at a lower speed, so that only part of the dewetting chemical agent in the liquid phase remains on the surface of the substrate, thereby reducing the sample amount in the subsequent freeze-drying, and improving the cleaning efficiency.

To sum up, in the disclosure, the dewetting chemical agent in the liquid phase is removed by sublimating after solidified. The solidified dewetting chemical agent can eliminate the vapor/liquid interface, so that the surface tension is approach to zero. Therefore, the capillary forces are eliminated in the subsequent sublimation and removal process, reducing the damage of the capillary forces to the substrate structure and achieving the effect of nondestructive cleaning. Meanwhile, because the influence of capillary force is eliminated, the residue of the cleaning agent and impurities on the surface of the substrate can be greatly reduced.

It should be noted that, the technical features in the technical solutions recorded by the embodiments can be arbitrarily combined without conflict. Those skilled in the art can change the sequence of operations of the formation method described above, without departing from the scope of protection of the disclosure.

The above mentioned is only the preferred embodiments of the disclosure, and is not intended to limit the scope of protection of the disclosure. Any modification, equivalent replacement and improvement made within the spirit and principles of the disclosure shall be included in the scope of protection of the disclosure.

What is claimed is:

1. A method for cleaning a substrate, comprising:
   removing impurities on a surface of the substrate by exposing the substrate to a first cleaning agent;
   removing the first cleaning agent on the surface of the substrate by exposing the substrate to a dewetting chemical agent in a liquid phase;
   solidifying the dewetting chemical agent in the liquid phase remaining on the surface of the substrate, to obtain the dewetting chemical agent in a solid phase; and
   sublimating and removing the dewetting chemical agent in the solid phase;
   wherein the removing the first cleaning agent on the surface of the substrate by exposing the substrate to a dewetting chemical agent in a liquid phase comprises:
   controlling the substrate to spin at a first speed, spraying the dewetting chemical agent in the liquid phase on the surface of the substrate, to dissolve the first cleaning agent remaining on the surface of the substrate in the dewetting chemical agent in the liquid phase; and
   controlling the substrate to spin at a second speed, to remove part of the dewetting chemical agent in the liquid phase on the surface of the substrate, wherein the second speed is less than the first speed;
   wherein the exposing the substrate to the first cleaning agent comprises:
   controlling the substrate to spin at a third speed, and spraying the first cleaning agent on the surface of the substrate; and
   controlling the substrate to spin at a fourth speed, and spraying the second cleaning agent on the surface of the substrate to remove the first cleaning agent on the surface of the substrate;
   wherein the solidifying the dewetting chemical agent in the liquid phase remaining on the surface of the substrate, to obtain the dewetting chemical agent in the solid phase comprises:
   controlling the substrate to spin at a fifth speed, and controlling a temperature and/or a pressure of a chamber, to bring the temperature of the chamber lower than a freezing point of the dewetting chemical agent in the liquid phase under the pressure of the chamber, and to solidify the dewetting chemical agent in the liquid phase remaining on the substrate into the dewetting chemical agent in the solid phase; and
   the removing the dewetting chemical agent in the solid phase comprises:
   controlling the substrate to spin at a sixth speed, and controlling the temperature and/or pressure of the chamber, to bring the temperature of the chamber higher than a sublimation point of the dewetting chemical agent in the solid phase under the pressure of the chamber, and to sublimate the dewetting chemical agent in the solid phase to the dewetting chemical agent in a gas phase;
   wherein each of the first speed, the third speed and the fourth speed is greater than the sixth speed, and the sixth speed is greater than the second speed and the fifth speed.

2. The method according to claim 1, wherein the solidifying the dewetting chemical agent in the liquid phase remaining on the surface of the substrate, to obtain the dewetting chemical agent in the solid phase comprises:

Controlling the temperature and/or the pressure of the chamber, to solidify the dewetting chemical agent from the liquid phase to the solid phase remaining on the surface of the substrate.

3. The method according to claim 1, wherein the sublimating and removing the dewetting chemical agent in the solid phase comprises:

controlling the temperature and/or the pressure of the chamber, to sublimate the dewetting chemical agent from the solid phase to the gas phase, and venting the dewetting chemical agent in the gas phase.

4. The method according to claim 1, wherein the surface of the substrate comprises a space structure having an aspect ratio greater than or equal to 8.

5. The method according to claim 1, further comprising, after removing the dewetting chemical agent in the solid phase, exposing the substrate to a cleaning gas to perform a plasma ashing treatment, wherein the cleaning gas comprises $H_2N_2$ gas.

6. The method according to claim 1, wherein a density value of the dewetting chemical agent in the liquid phase is less than a density value of the dewetting chemical agent in the solid phase.

7. The method according to claim 1, wherein the dewetting chemical agent in the liquid phase has a saturated vapor pressure of greater than 4.0 KPa at room temperature and has an evaporation rate greater than 1; a miscibility of the dewetting chemical agent in the liquid phase with the first cleaning agent is greater than 70% by volume.

8. The method according to claim 1, wherein the dewetting chemical agent in the liquid phase comprises acetone or isopropanol.

9. The method according to claim 1, wherein the solidifying the dewetting chemical agent in the liquid phase remaining on the surface of the substrate, to obtain the dewetting chemical agent in the solid phase comprises:

controlling the fifth speed of the substrate in a range of 5 rpm to 50 rpm, controlling the temperature of the chamber in a range of −120° C. to −40° C., and controlling the pressure of the chamber in a range of 0.1 mTorr to 100 mTorr; and and wherein the removing the dewetting chemical agent in the solid phase comprises:

controlling the sixth speed of the substrate in a range of 100 rpm to 1000 rpm, and the temperature of the chamber in a range of 20° C. to 50° C.

10. The method according to claim 3, further comprising, after venting the dewetting chemical agent in the gas phase, Exposing the substrate to an inert gas, to bring the substrate in an environment of atmospheric pressure, wherein the inert gas is purged from a center toward an edge of the substrate.

11. The method according to claim 5, wherein the $H_2N_2$ gas has a purity of at least 98% by volume.

* * * * *